United States Patent [19]

Holonyak, Jr.

[11] 4,365,260
[45] Dec. 21, 1982

[54] SEMICONDUCTOR LIGHT EMITTING DEVICE WITH QUANTUM WELL ACTIVE REGION OF INDIRECT BANDGAP SEMICONDUCTOR MATERIAL

[75] Inventor: Nick Holonyak, Jr., Urbana, Ill.

[73] Assignee: University of Illinois Foundation, Urbana, Ill.

[21] Appl. No.: 214,894

[22] Filed: Dec. 8, 1980

Related U.S. Application Data

[62] Division of Ser. No. 951,515, Oct. 13, 1978, Pat. No. 4,270,094.

[51] Int. Cl.³ .............................................. H01L 33/00
[52] U.S. Cl. ......................................... 357/17; 357/16
[58] Field of Search .............................. 357/17, 16, 18

[56] References Cited

U.S. PATENT DOCUMENTS

| | | | |
|---|---|---|---|
| 3,443,102 | 5/1969 | Kaye | 357/30 X |
| 3,614,549 | 10/1971 | Lorenz | 357/16 |
| 3,691,476 | 9/1972 | Hayashi | 357/18 X |
| 4,194,935 | 3/1980 | Dingle | 357/16 |
| 4,205,329 | 5/1980 | Dingle | 357/16 |

Primary Examiner—Martin H. Edlow
Attorney, Agent, or Firm—Martin Novack

[57] ABSTRACT

Advantageous operation can be achieved in a semiconductor heterostructure light emitting device by utilizing a single thin active layer which exhibits quantum size effects. It has been found that performance can be degraded by employing a single quantum layer that is thinner than a certain minimum thickness, this minimum thickness being about 100 Angstroms, (the approximate carrier scattering path length). In one form of the invention, there is provided a semiconductor heterostructure device which includes first and second relatively wide bandgap semiconductor regions of opposite conductivity types. A single quantum well active layer is disposed between the first and second regions. The active layer is formed of a relatively narrow bandgap semiconductor having a thickness which is in the range of about 100 to 400 Angstroms, and is preferably about 200 Angstroms. One preferred combination of materials for the device comprises aluminum gallium arsenide for the relatively wide bandgap semiconductor regions, and gallium arsenide for the single active layer. However, other combinations of materials may be suitable, for example: indium phosphide for the relatively wide bandgap regions and indium gallium phosphide arsenide for the single active layer; or indium gallium arsenide phosphide for the relatively wide bandgap regions and gallium arsenide phosphide for the single active layer; or aluminum gallium arsenide phosphide for the confining layer and gallium arsenide phosphide for the active layer. The latter two are particularly useful as emitters in the visible portion of the spectrum. In a further form of the invention, there is disclosed a semiconductor heterostructure device wherein the active region comprises one or more quantum layers of an indirect bandgap semiconductor material, preferably germanium.

12 Claims, 7 Drawing Figures

SEMICONDUCTOR LIGHT EMITTING DEVICE WITH QUANTUM WELL ACTIVE REGION OF INDIRECT BANDGAP SEMICONDUCTOR MATERIAL

This invention was made in the course of work supported by the U.S. Office of Naval Research, Contract N00014-77-C-0086 and National Science Foundation Grant DMR 76-82432.

This application is a division of application Ser. No. 951,515, filed Oct. 13, 1978, now U.S. Pat. No. 4,270,094.

BACKGROUND OF THE INVENTION

This invention relates to light emitting devices and, more particularly, to semiconductor heterostructure light emitters.

Various types of semiconductor light emitters are described in the prior art. For example, in a gallium arsenide homojunction light emitter, electrons are injected across a pn junction, combine with holes, and give up excess energy by emitting light at a wavelength characteristic of the material. In a so-called double heterojunction light emitter, fabricated, for example, using a gallium arsenide/aluminium gallium arsenide material system, a pair of relatively wide bandgap layers (aluminum gallium arsenide) of opposite conductivity type are sandwiched around an active region (gallium arsenide). The interfaces between the active region and the wide bandgap layers form a pair of heterojunctions. These heterojunctions effectively provide carrier confinement and optical confinement. The devices may be used as light emitting diodes or lasers, and may be energized using an electrical current or optical pumping.

There are a number of practical constraints which affect operation and performance of semiconductor light emitting devices. For example, relatively high current densities may be necessary to achieve a desired level of light emission or laser action. Temperature is a significant consideration and, while it is desirable to have devices that work at room temperature, lower temperature operation may be required if continuous operation is desired. At room temperature, pulsed operation is typically necessary since continuous operation can cause overheating. The wavelength of the radiation produced is also significant, and is not generally a matter of flexible choice. The wavelength of radiation generated by conventional double heterojunction devices is a function of the bandgap of the active region. Within limits, the wavelength of the radiation produced can be changed by altering the composition of the active region.

In the U.S. Pat. No. 3,982,207, there is disclosed a heterostructure laser having a multi-layered semi-conductor body which includes an active region having a plurality of thin narrow bandgap active layers interleaved with a plurality of thin relatively wider bandgap passive layers. The passive layers are thin enough (indicated as being less than about 500 Angstroms) to permit carriers to distribute themselves among the active layers when the body is pumped (either optically or electrically). The distribution of carriers is stated to occur either by tunneling through, or by hopping over, the energy barriers created by the passive layers. The active layers are thin enough (indicated as being less than about 500 Angstroms and preferably about 50 Angstroms) to separate the discrete energy levels of confined carriers. In this manner, the patent indicates that quantum size effects are exploited to produce wavelength tuneability without having to rely on changes of the composition of the active region, and also to achieve lower lasing thresholds. The exceedingly thin layers of this patent are indicated as being made using molecular beam epitaxy techniques.

It is an object of the present invention to provide improved semiconductor heterostructure devices which exploit quantum size effects in a novel manner to achieve operational advantages in various applications.

SUMMARY OF THE INVENTION

Applicant has discovered that advantageous operation can be achieved in a semiconductor heterostructure light emitting device by utilizing a single thin active layer which exhibits quantum size effects. The thickness of this layer is quite important. It has generally been believed that it is advantageous to have the active quantum layers as thin as possible, but applicant has found that performance can be degraded by employing a single quantum layer that is thinner than a certain minimum thickness, this minimum thickness being about 100 Angstroms, (the approximate carrier scattering path length).

In one form of the present invention, there is provided a semiconductor heterostructure device which includes first and second relatively wide bandgap semiconductor regions of opposite conductivity types. A single quantum well active layer is disposed between the first and second regions. The active layer is formed of a relatively narrow bandgap semiconductor having a thickness which is in the range of about 100 of 400 Angstroms, and is preferably about 200 Angstroms. One preferred combination of materials for the device of this form of the invention comprises aluminium gallium arsenide for the relatively wide bandgap semiconductor regions, and gallium arsenide for the single active layer. However, other combinations of materials may be suitable, for example: indium phosphide for the relatively wide bandgap regions and indium gallium phosphide arsenide for the single active layer; or indium gallium arsenide phosphide for the relatively wide bandgap regions and gallium arsenide phosphide for the single active layer; or aluminum gallium arsenide phosphide for the confining layer and gallium arsenide phosphide for the active layer. The latter two are particularly useful as emitters in the visible portion of the spectrum.

As noted above, the thickness of the quantum layer is an important factor in performance of the device. On one hand, it is desirable to have a very thin layer, preferably less than about 400 Angstroms, to take full advantage of quantum size effects. On the other hand, applicant has found that carrier scattering and collection in a quantum well weakens and becomes ineffective for thicknesses significantly smaller than about 100 Angstroms.

In a further form of the invention, there is disclosed a semiconductor heterostructure device wherein the active region comprises one or more quantum layers of an indirect bandgap semiconductor material, preferably germanium. Applicant discloses that substantial luminescence can be obtained using this indirect gap semiconductor material (which has generally been considered a relatively poor light emitter) when a thin layer (or layers) thereof, exhibiting quantum size effects, is utilized in semiconductor devices of the type disclosed herein.

Further features and advantages of the invention will become more readily apparent from the following detailed description when taken in conjunction with the accompanying drawings.

DESCRIPTION OF THE PREFERRED EMBODIMENT

Figure 1:
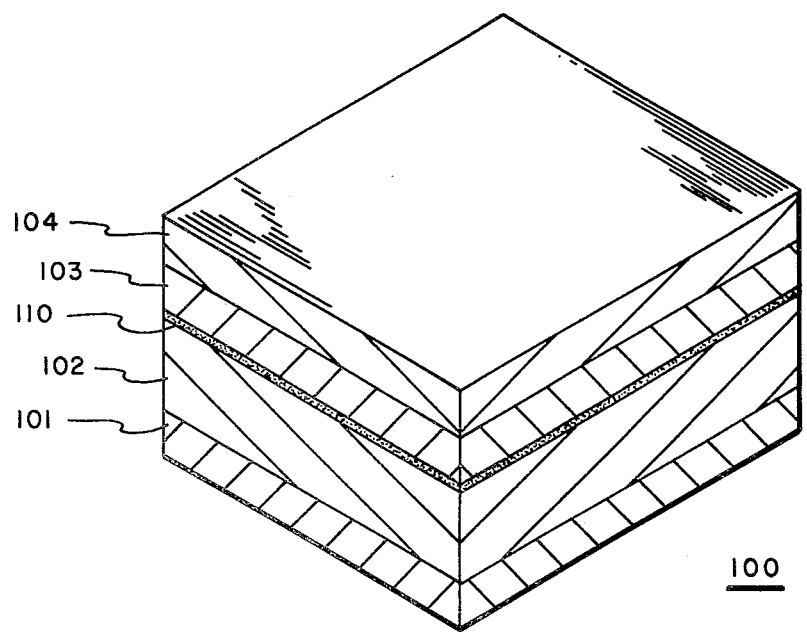
FIG. 1 illustrates a semiconductor heterostructure device in accordance with an embodiment of the invention.

Referring to FIG. 1, there is shown an embodiment of a semiconductor heterostructure device in accordance with one form of the invention. A body 100 includes outer buffer or contact layers 101 and 104, a pair of confining regions 102 and 103 which are of opposite conductivity type, and a single active layer 110 between the confining regions 102 and 103. The confining regions 102 and 103 are of a relatively wide bandgap semiconductor material, and the single active layer 110 is of a relatively narrow bandgap semiconductor and acts as a quantum well or trap between the confining regions. The active layer has a thickness in the range of about 100 to 400 Angstroms, and preferably about 200 Angstroms.

An operational embodiment of the structure of FIG. 1 is as follows:

layer 101: 1 μm GaAs: Se (n∼1×10$^{18}$cm$^{-3}$)

region 102: 2 μm $-Ga_{0.4}Al_{0.6}As$: Se (n∼5×10$^{17}$cm$^{-3}$)

layer 110: (thickness =L$_z$) GaAs (undoped—n<1×10$^{15}$cm$^{-3}$)

region 103: 0.3 μm $Ga_{0.5}Al_{0.5}As$: Zn (p∼2×10$^{17}$cm$^{-3}$)

Layer 104: 1 μm GaAs: Zn (p∼2×10$^{18}$cm$^{31\ 3}$)

The device is preferably, although not necessarily, grown by metalorganic chemical vapor deposition ("MO-CVD"), which is described, for example, in a publication entitled "Chemical Vapor Deposition For New Materials Applications" that appeared in the June, 1978 issue of Electronic Packaging And Production. The devices herein may also be grown by molecular beam epitaxy, liquid phase epitaxy, or any other suitable deposition technique, although MO-CVD is presently preferred.

The heterostructure of FIG. 1 can be grown using MO-CVD by employing the metal alkyls trimethylgallium (TMGa) and trimethylaluminum (TMAl) as sources of the group III elements Ga and Al. The hydride AsH$_3$ is used as the source of the group V element As. H$_2$Se is used as a source of Se for n-type doping, and diethylzinc (DEZn) is used as a source of Zn for p-type doping. The various layers are grown sequentially at 750° C. on {100} GaAs substrates using growth rates of ∼0.25 μm/min.

Figure 2:
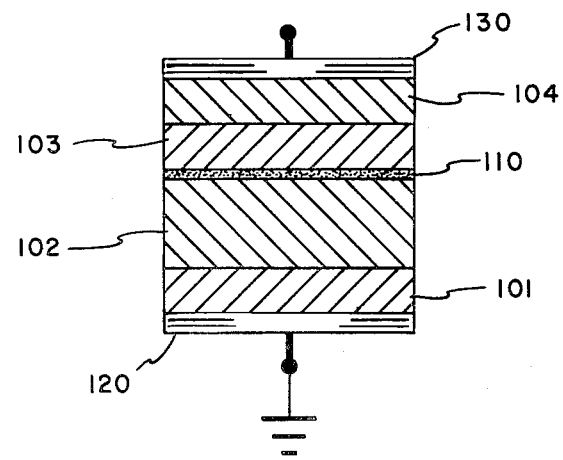
FIG. 2 is a cross-sectional view of a form of the device of FIG. 1 when used as a diode.

In one use of the structure of FIG. 1, metal electrodes 120 and 130 are deposited on the gallium oxide layers 101 and 104, the layers 101 and 104 being respectively utilized for providing a damage free growing surface and for contact purposes. Typically, the grown structure is cleaved and saw-cut into dice, and then assembled into diodes, a diode being illustrated in FIG. 2.

Figure 3:
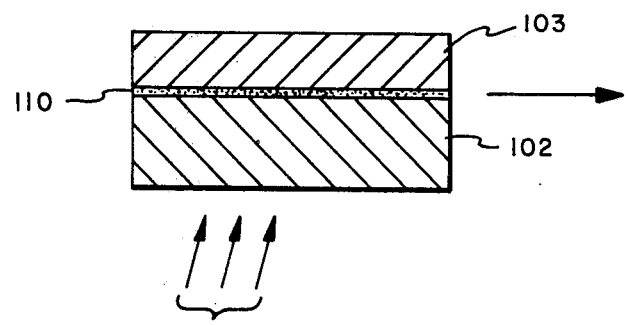
FIG. 3 is another form of device of FIG. 1, when energized using photopumping.
Figure 4:
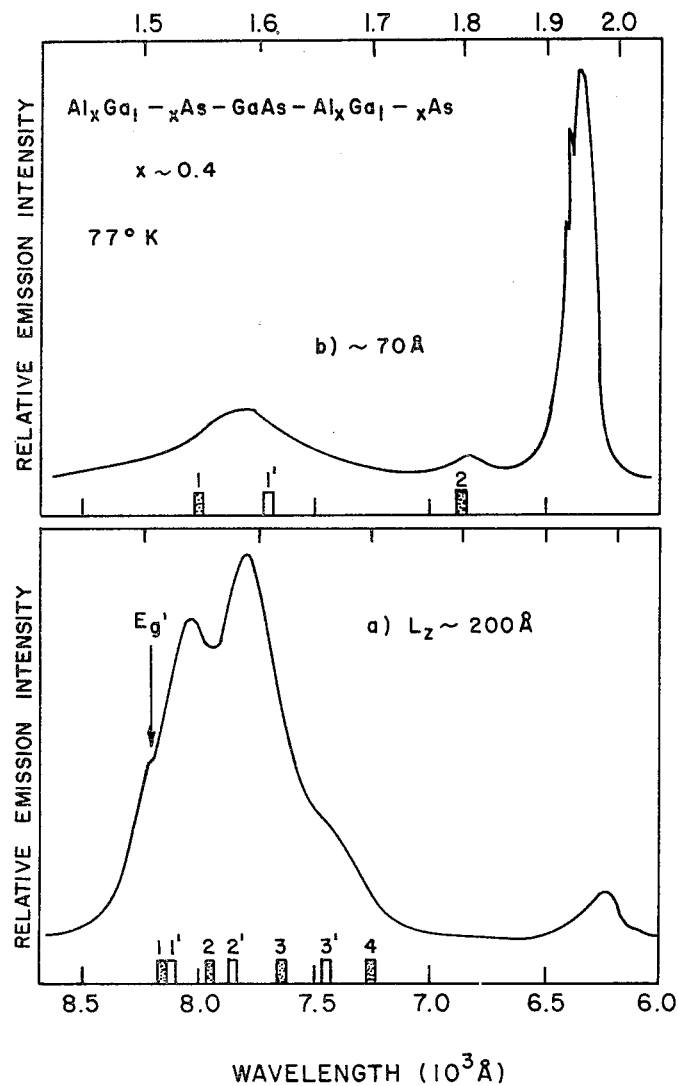
FIG. 4 shows graphs which represent the operation of devices in accordance with the invention.

For optical pumping, the buffer layer 101 is removed by first polishing and then using a selective etch that stops at the region 102. The resulting device is cleaved into rectangular strips and then compressed into an indium heat sink. A diagram of the photopumped structure is illustrated in FIG. 3. This structure can be used to show the effects of having a single active layer which is too thin. Samples designated (a) and (b) were respectively fabricated with active layer (layer 110) thicknesses of L$_z$∼200 Angstroms and L$_z$∼70 Angstroms. The samples were photoexcited, on the side of the 0.3 μm $Al_xGa_{1-x}As$ confining region (103), with the continuous or cavity-dumped output of an Ar$^+$ laser (λ=5145 Angstroms). Excitation levels as high as >2.4×10$^4$W/cm$^2$ or the equivalent in current density of J≳10$^4$A/cm$^2$ were readily achieved. At a moderate excitation level (10$^3$−10$^4$W/cm$^2$), the emission spectra (77° K.) of FIG. 4 were obtained. Graph (a) is for the case L$_z$∼200 Angstroms and graph (b) is the case for L$_z$∼70Å. The dark and light markers on the horizontal axis of the graph indicate the calculated positions of the electron-to-heavy-hole (e→1h, n') confined-particle transitions. For the L$_z$∼200 Angstroms sample (a), relatively little $Al_xGa_{1-x}As$ emission (λ∼6250 Angstroms) is observed compared to the large emission band from the GaAs quantum well. Almost all of the carriers, which are generated (by photoexcitation) in ∼1/α∼10$^{-4}$cm of the $Al_xGa_{1-x}As$ confining regions (102 and 103) diffuse and are collected in the thin GaAs layer. In fact, it is very easy to obtain laser operation on the GaAs quantum-well states labeled on the horizontal axis of FIG. 4, graph (a). If this sample (a) is photopumped from the opposite side (the side of the 1 μm confining layer), laser operation occurs on the $Al_xGa_{1-x}As$ peak, thus indicating that excess carriers diffuse as far as 0.3 μm (FIG. 4, graph (a)), but not as far as 1.0 μm, before recombining. It can be concluded that a quantum well of dimension L$_z$∼200 Angstroms is indeed a good collector of excess carriers.

When the composition and overall dimensions of the sample are preserved but the GaAs quantum well is reduced in thickness to L$_z$∼100 Angstroms, it becomes increasingly difficult to obtain laser operation on the lower energy states of the well. When the well dimension is reduced still further, it is almost impossible to observe stimulated emission on GaAs confined-particle transitions. Instead the emission behavior of FIG. 4, graph (b) is observed. The sample (b) (L$_z$∼70 Angstroms) was excited from the side of the 0.3 μm confining region, and yet relatively little GaAs recombination radiation was observed compared to $Al_xGa_{1-x}As$ (x∼0.4) emission. In fact, it was very difficult to suppress stimulated emission originating from the recombination in the confining layers. To attempt to restore quantum-well laser oscillations, the overall sample thickness, and thus cavity thickness, was reduced by over 50% by carefully etching and reducing the thickness of the 1.0 μm confining layer. This produced no substantial change in the type of spectrum observed in FIG. 4, graph (b). One can conclude that for L$_z$<100

Angstroms the GaAs quantum well is no longer an effective collector of excess carriers.

The present conclusions concerning thickness of the active layer may be explained by considering the process of electron diffusion across the quantum well while simultaneously undergoing scattering. In the related problem of photoelectric emission from a solid, Fermi's "age theory" has been applied (see Hebb, M. H. Phys. Rev. 81, 702 (1951) to obtain the energy distribution of electrons after traveling a fixed distance, here $L_z$. If the initial energy of all of the electrons at one well boundary is the same, the energy distribution of the electrons arriving at the opposite boundary, $L_z$, is $$F(E_p) = (\text{const}) (E_p)^{-3/2} \exp\{-3L_z^2 \delta E/(4l_p^2 E_p)\}, \quad (1)$$

where $E_p$ is the energy lost by an electron in traversing the distance $L_z$, $l_p$ is the mean free path for scattering, and $\delta E$ is the mean energy loss per collision. The initial energy distribution of the electrons thermalized at the bottom of the conduction band of the $Al_xGa_{1-x}As$ confining layer, $$n_d(E) \propto E^{\frac{1}{2}} \exp(-E/kT), \quad (2)$$

can be used to generalize Eq. 1. (See Escher et al., J. Appl. Phys. 44, 5309 (1973)). The electron distribution after travel of a distance of $L_z$ is then given by $$N(E) = \Sigma n_d(E + E_p - \Delta E_c) F(E_p), \quad (3)$$

where $\Delta E_c$ is the conduction band discontinuity between $Al_xGa_{1-x}As$ and GaAs and the sum is taken over all possible electron energy loss $E_p$.

Figure 5:
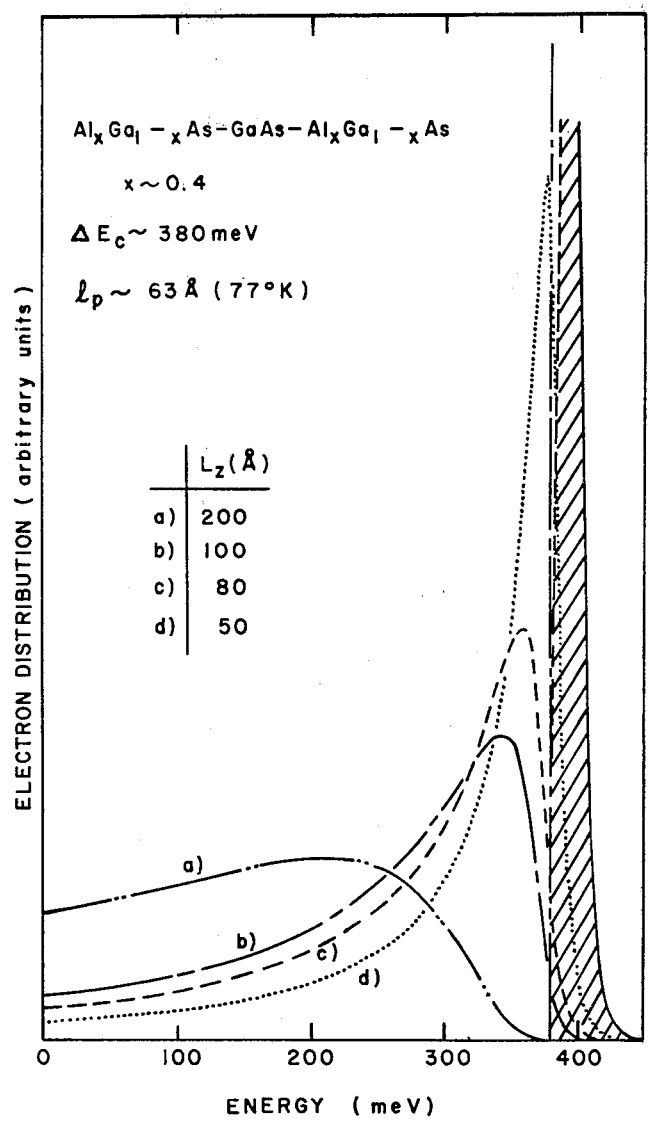
FIG. 5 is a graph of electron distribution.

Taking the electron mean free path as $l_p = 63$ Angstroms (see James et al., Phys. Rev. 183,740 (1969)) and the energy loss per collision as $\delta E = 36$ meV (LO phonon energy), Eq. (3) can be evaluated numerically and its behavior is shown for various $L_z$ in FIG. 5. The initial electron distribution in the $Al_xGa_{1-x}As$ ($\gtrsim 380$ meV) is shown cross hatched in FIG. 5; the area under each of the curves being normalized. Although the curves of FIG. 5 do no represent the final thermal distributions of electrons, they do indicate, however, that as the GaAs quantum well is made smaller the electron distribution (in the well) shifts toward higher energy. Thus, some of the carriers are not collected and, in addition, higher energy electrons (>300 meV) transfer to L indirect minima, which are ~300 meV above $\Gamma$ (see Aspnes et al., Phys. Rev. Lett. 37, 766 (1976)), and do not contribute to the recombination radiation. The results hereof, which are not particularly sensitive to temperature, show that for $L_z \rightarrow l_p$ a single semiconductor quantum well, located between larger bandgap confining layers, loses its effectiveness as a collector of excess carriers and as a source of recombination radiation.

The device of FIG. 3 has been operated in a continuous mode at room temperature at relatively low power thresholds. Devices in accordance with the invention can also be made using other combinations of materials, for example: indium phosphide for the relatively wide bandgap regions and indium gallium phosphide arsenide for the single active layer; or indium gallium arsenide phosphide for the relatively wide bandgap regions and gallium arsenide phosphide for the single active layer; or aluminum gallium arsenide phosphide for the confining layer and gallium arsenide phosphide for the active layer. The latter two are particularly useful as emitters in the visible portion of the spectrum.

Figure 6:
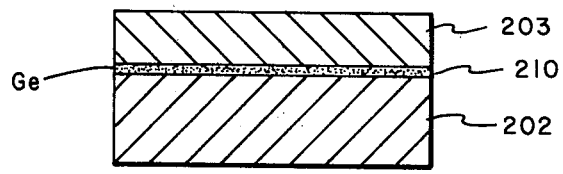
FIGS. 6 and 7 illustrate semiconductor heterostructure devices in accordance with further embodiments of the invention.
Figure 7:
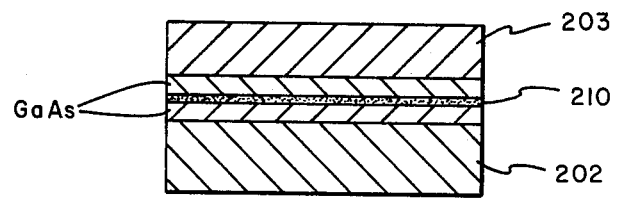

In a further form of the invention, a semiconductor heterostructure device is provided wherein the active region comprises one or more quantum layers of an indirect bandgap semiconductor material, preferably germanium. Applicant discloses that substantial luminescence can be obtained using this indirect gap semiconductor material (which has generally been considered a relatively poor light emitter) when a thin layer (or layers) thereof, exhibiting quantum size effects, is utilized in semiconductor devices of the type disclosed herein. FIG. 6 shows the structure of the device wherein a layer 210 of Ge layer is employed between $Al_xGa_{1-x}As$ regions 202 and 203. In FIG. 7 GaAs layers are interposed between the Ge and the $Al_xGa_{1-x}As$ regions, the version providing fabrication advantages for some types of manufacture.

I claim:

1. A semiconductor light emitter heterostructure device, comprising:
   first and second relatively wide bandgap semiconductor regions of opposite conductivity types; and
   an active region disposed between said first and second regions, said active region comprising a quantum well active layer of a relatively narrow bandgap indirect bandgap semiconductor material, said layer having a thickness in the range of about 100 to 400 Angstroms.

2. The device as defined by claim 1, wherein said indirect gap semiconductor material comprises germanium.

3. The device as defined by claim 1, wherein the thickness of said active layer is about 200 Angstroms.

4. The device as defined by claim 2, wherein the thickness of said active layer is about 200 Angstroms.

5. The device as defined by claim 1, wherein said first and second regions comprise $Al_xGa_{1-x}As$.

6. The device as defined by claim 2, wherein said first and second regions comprise $Al_xGa_{1-x}As$.

7. The device as defined by claim 3, wherein said first and second regions comprise $Al_xGa_{1-x}As$.

8. The device as defined by claim 4, wherein said first and second regions comprise $Al_xGa_{1-x}As$.

9. The device as defined by claim 5, wherein said active region further comprises thin layers of GaAs between the $Al_xGa_{1-x}As$ regions and the germanium layers.

10. The device as defined by claim 8, wherein said active region further comprises thin layers of GaAs between the $Al_xGa_{1-x}As$ regions and the germanium layer.

11. The device as defined by claim 1 wherein said active layer is a single active layer.

12. The device as defined by claim 2 wherein said active layer is a single active layer.

* * * * *